(12) United States Patent
Qi

(10) Patent No.: US 10,770,572 B2
(45) Date of Patent: Sep. 8, 2020

(54) LATERAL INSULATED-GATE BIPOLAR TRANSISTOR AND MANUFACTURING METHOD THEREFOR

(71) Applicant: CSMC TECHNOLOGIES FAB2 CO., LTD., Wuxi New District, Jiangsu (CN)

(72) Inventor: Shukun Qi, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/311,276

(22) PCT Filed: Jun. 21, 2017

(86) PCT No.: PCT/CN2017/089279
§ 371 (c)(1),
(2) Date: Dec. 19, 2018

(87) PCT Pub. No.: WO2017/219968
PCT Pub. Date: Dec. 28, 2017

(65) Prior Publication Data
US 2019/0245069 A1    Aug. 8, 2019

(30) Foreign Application Priority Data

Jun. 21, 2016 (CN) .......................... 2016 1 0452720

(51) Int. Cl.
*H01L 29/739* (2006.01)
*H01L 29/78* (2006.01)
(Continued)

(52) U.S. Cl.
CPC ...... *H01L 29/7393* (2013.01); *H01L 29/1095* (2013.01); *H01L 29/41708* (2013.01); *H01L 29/739* (2013.01); *H01L 29/78* (2013.01)

(58) Field of Classification Search
CPC .......................... H01L 29/66325–66348; H01L 29/7393–7398; H01L 2924/13055; H01L 29/083–0834
See application file for complete search history.

(56) References Cited

U.S. PATENT DOCUMENTS 6,313,000 B1  11/2001  Kitch
8,253,164 B2   8/2012  Hsieh
(Continued)

FOREIGN PATENT DOCUMENTS

CN      2914330 Y    6/2007
CN    102148240 A    8/2011
(Continued)

OTHER PUBLICATIONS

Plummer, Silicon VLSI Technology, 2000, Prentice Hall, pp. 17-18 (Year: 2000).*

(Continued)

*Primary Examiner* — Tucker J Wright
(74) *Attorney, Agent, or Firm* — Polsinelli PC

(57) ABSTRACT

A lateral insulated-gate bipolar transistor and a manufacturing method therefor. The lateral insulated-gate bipolar transistor comprises a substrate, an anode terminal and a cathode terminal on the substrate, and a drift region and a gate electrode located between the anode terminal and the cathode terminal. The anode terminal comprises an N-shaped buffer zone on the substrate, a P well in the N-shaped buffer zone, an N+ zone in the P well, a groove located above the N+ zone and partially encircled by the P well, polycrystalline silicon in the groove, P+ junctions at two sides of the groove, and N+ junctions at two sides of the P+ junctions.

8 Claims, 2 Drawing Sheets

(51) Int. Cl.
*H01L 29/10* (2006.01)
*H01L 29/417* (2006.01)

(56) References Cited

U.S. PATENT DOCUMENTS

| | | |
|---|---|---|
| 2005/0062101 A1* | 3/2005 | Sugi .................. H01L 21/76283 |
| | | 257/330 |
| 2007/0158678 A1 | 7/2007 | Udrea |
| 2009/0008675 A1 | 1/2009 | Lu |
| 2015/0008481 A1 | 1/2015 | Pathirana et al. |
| 2015/0255450 A1 | 9/2015 | Shrivastava et al. |

FOREIGN PATENT DOCUMENTS

| | | |
|---|---|---|
| CN | 102157550 A | 8/2011 |
| CN | 104347397 A | 2/2015 |
| CN | 105789298 A | 7/2016 |
| JP | 2005-101581 A | 4/2005 |

OTHER PUBLICATIONS

International Search Report dated Sep. 15, 2017 in the parent application PCT/CN2017/089279. 12 pages.
European Search Report dated Jan. 3, 2020 issued in corresponding European Patent Application No. 17814706.2 (8 pages).
Office Action dated Mar. 28, 2019 issued in corresponding Chinese Patent Application No. 201610452720.0 (10 pages).
Office Action dated Apr. 2, 2020 issued in corresponding Japanese Patent Application No. 2018-566861 (4 pages).
Office Action dated Apr. 10, 2020 issued in corresponding Korean Patent Application No. 10-2018-7036722 (5 pages).

* cited by examiner

LATERAL INSULATED-GATE BIPOLAR TRANSISTOR AND MANUFACTURING METHOD THEREFOR

CROSS REFERENCE TO RELATED APPLICATION

This application is a National Phase filing under 35 U.S.C. § 371 of PCT/CN2017/089279 filed on Jun. 21, 2017, and claims priority to Chinese Patent Application No. CN 201610452720.0, entitled "LATERAL INSULATED-GATE BIPOLAR TRANSISTOR AND MANUFACTURING METHOD THEREFOR" filed on Jun. 21, 2016. The entire contents of each application are hereby incorporated by reference.

TECHNICAL FIELD

The present disclosure relates to semiconductor technologies, and more particularly relates to a lateral insulated-gate bipolar transistor, and a manufacturing method of the lateral insulated-gate bipolar transistor.

BACKGROUND

Lateral insulated-gate bipolar transistor (LIGBT) is usually employed as an output stage of high-voltage power-driven integrated circuit. Compared with reducing of the on-resistance by a single carrier of a lateral double diffusion metal-oxide semiconductor field effect transistor (LDMOS), the structure of LIGBT can exhibit a lower on-resistance due to a conductive modulation effect formed by injection of double carriers of both electrons and holes.

However, when LIGBT is turned off, the drift region of LIGBT has a longer turn-off time due to residual minority carrier holes, so there is a problem of a larger power consumption. Because the on-resistance and the turn-off time are inversely proportional to the hole concentration, how to strike a balance between the on-resistance and the turn-off time has become a direction for continuous improvement of the LIGBT device.

SUMMARY

Accordingly, it is necessary to provide a lateral insulated-gate bipolar transistor and a manufacturing method thereof, which can be turned off quickly on the basis of ensuring low on-resistance.

A lateral insulated-gate bipolar transistor includes a substrate, an anode terminal and a cathode terminal on the substrate, and a drift region and a gate located between the anode terminal and the cathode terminal. The anode terminal includes an N-type buffer region on the substrate, a P well in the N-type buffer region, an N+ region in the P well, a trench located above the N+ region and partially surrounded by the P well, a polysilicon in the trench, P+ junctions at both sides of the trench, and N+ junctions at both sides of the P+ junction.

A method of manufacturing a lateral insulated-gate bipolar transistor includes: implanting N-type ions into a silicon wafer, and performing a drive-in to form an N-type buffer region; depositing a hard mask layer on a surface of the silicon wafer, and performing trench lithography and etching using a photoresist to etch the hard mask layer to form a trench window; etching silicon below the trench window to form a trench; performing a liner oxidation to form a liner oxide layer on an inner surface of the trench; wherein a thickness of the liner oxide layer at a sidewall of the trench is greater than a thickness of the liner oxide layer at a bottom of the trench; implanting P-type ions through the trench window, and the ions pass through the oxide layer and form a P well within an N-type buffer region around the trench; depositing an oxide layer in the trench, and forming an oxide film on the sidewall of the trench and a spacer structure at both sides of the bottom of the trench after etching the oxide layer; implanting N-type ions into the trench, and forming an N+ region by a self-aligned implantation under a blocking of the oxide film and the spacer; depositing a polysilicon in the trench, peeling off the hard mask layer after etching the polysilicon; performing annealing to the P well and the N+ region; and forming P+ junctions at both sides of the trench and N+ junctions at both sides of the P+ junction by lithography and etching.

In the aforementioned lateral insulated-gate bipolar transistor, on the one hand, a plurality of holes are injected during forward conduction, thereby forming a significant conductivity modulation effect to reduce the on-state resistance; on the other hand, when the device is turned off, the N+ region and the N+ junction can quickly absorb the minority carrier holes, thereby greatly reducing turn-off loss.

BRIEF DESCRIPTION OF THE DRAWINGS

Further objects, characteristics and advantages of present disclosure will become apparent from the detailed description of preferred embodiments illustrated in accompanying drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "left", "right" and similar expressions are for illustrative purposes only.

The semiconductor vocabularies used herein are technical terms commonly used by those skilled in the art. For example, with respect to P-type and N-type impurities, in order to distinguish the dopant concentration, a P+ type simply represents a P-type with heavily doped concentration, a P type represents a P-type with medium doped concentration, and a P− type represents a P-type with lightly doped concentration. An N+ type represents an N-type with heavily doped concentration, an N type represents an N-type with medium doped concentration, and an N− type represents an N-type with lightly doped concentration.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

Due to the long drift region, along with the low conduction voltage drop due to the conductivity modulation effect, the lateral insulated-gate bipolar transistor technology suffers from problem of long turn-off time caused by remaining minority carriers in the drift region. Therefore, how to strike a balance between the on-state voltage drop and the turn-off time has become a direction for continuous improvement of the lateral insulated-gate bipolar transistor.

Figure 1:
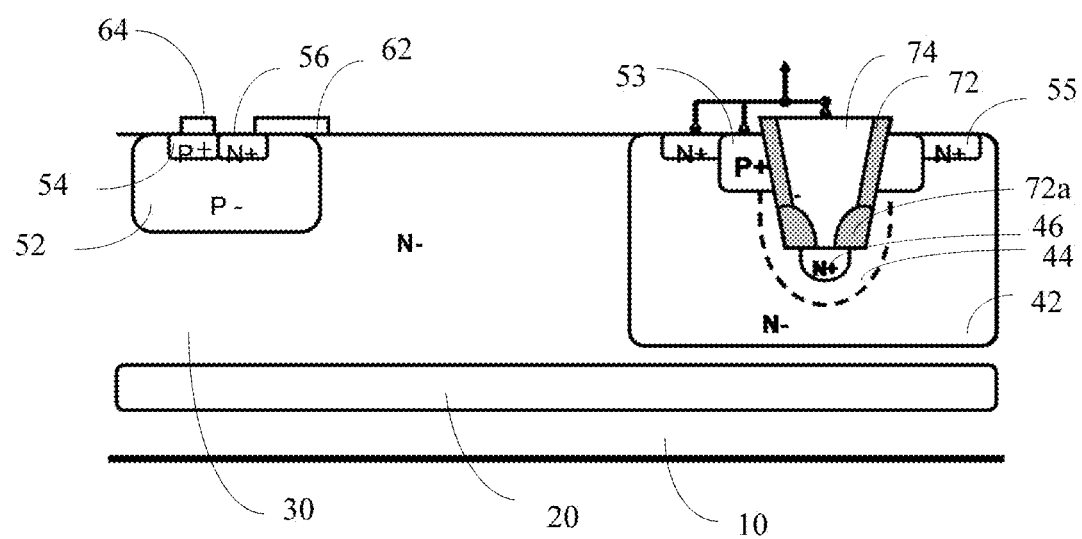
FIG. 1 is a cross-sectional view of a lateral insulated-gate bipolar transistor according to one embodiment.

FIG. 1 is a schematic view of a lateral insulated-gate bipolar transistor according to one embodiment. The lateral insulated-gate bipolar transistor includes a substrate 10, an anode terminal and a cathode terminal formed on the substrate 10, and a drift region 30 and a gate 62 located between the anode terminal and the cathode terminal (a gate oxide layer at a bottom of the gate 62 is omitted in FIG. 1). The anode terminal includes an N-type buffer region 42 on the substrate 10, a P well 44 in the N-type buffer region 42, an N+ region 46 in the P well 44, a trench located above the N+ region 46 and partially surrounded by the P well 44, a polysilicon 74 in the trench, P+ junctions 53 at both sides of the trench, and N+ junctions 55 at both sides of the P+ junction 53. The cathode terminal includes a P− region 52 on the substrate 10, a P-type body region 54 and an emitter N+ region 56 in the P− region 52, and a cathode metal 64 serves as an electrode of the emitter.

In the aforementioned lateral insulated-gate bipolar transistor, when the gate 62 is forward biased, the device channel is turned on, the electron current flows from the N+ region 56 of the emitter, passes through the channel of the P− region 52, and enters the drift region 30, the N-type buffer region 42, and the N+ region 46. When the collector is forward biased, the holes begin to be injected into the N-type buffer region 42 through a large area of the PN junction from the P well 44 of the collector, thereby achieving high-efficient multi-path majority carrier holes injection and greatly reducing the on-resistance. When the LIGBT is turned off inversely, the collector (including the P+ junction 53 and the N+ junction 55) is forward biased, the N+ region 46, the P well 44, and the N-type buffer region 42 form a lower resistance path for hole injection, which starts to quickly extract the remaining minority carrier holes in the drift region 30, such that a faster switching speed is guaranteed, and the purpose of quick turning off can be achieved.

In the embodiment illustrated in FIG. 1, the trench is a structure gradually increased in width from bottom to top to form a slope and having a narrow bottom and a wide top.

In the embodiment illustrated in FIG. 1, a dopant concentration of the N-type buffer region 42 is less than a dopant concentration of the P well 44, and the dopant concentration of the P well 44 is less than dopant concentrations of the P+ junction 53 and the N+ junction 55. In one embodiment, the dopant concentration of the N-type buffer region 42 ranges from $2E^{15}$ to $5E^{15}$ cm$^{-3}$, the dopant concentration of the P well 44 ranges from $4E^{17}$ to $8E^{17}$ cm$^{-3}$, and the dopant concentrations of the P+ junction 53 and the N+ junction 55 range from $5E^{20}$ to $10E^{20}$ cm$^{-3}$.

In the embodiment illustrated in FIG. 1, the anode terminal further includes an oxide layer located on an inner surface of the trench. The oxide layer includes an oxide film 72 located on a sidewall of the trench and spacer structures 72a located at both sides of the bottom of the trench. The oxide layer has a void at a position corresponding to a middle portion of the bottom of the trench, such that the polysilicon 74 in the trench is in direct contact with the N+ region 46 below.

In the illustrated embodiment, the polysilicon 74 located at both sides of the bottom of the trench is an N+ heavily doped polysilicon, and the dopant concentration is in an order of $E^{21}$ to $E^{22}$ cm$^{-3}$.

Silicon-on-insulator (SOI) technology is becoming increasingly important in HVIC and SPIC applications, while the IGBT device has gradually played an important role in the field of power device applications due to its low on-resistance characteristics caused by high input impedance and conductivity modulation effect. Compared to the bulk silicone junction isolated devices, the LIGBT device of SOI type achieves an increasing application in the automotive electronics, home electronics and communications and industrial applications due to its features of low current leakage, low on-state resistance, high input impedance, high package density, fast switching, significant noise reduction effect and feasibility under high temperature work caused by trench isolation. It is particularly important to require an efficient injection of holes and a significant conductive modulation effect to reduce the on-state resistance, but correspondingly increase the turn-off loss caused by that minority carrier holes cannot be annihilated quickly when the device is turned off. The LIGBT shown in FIG. 1 is a silicon on insulator type lateral insulated-gate bipolar transistor (SOI-LIGBT), which includes a buried oxide layer 20 located between the substrate 10 and the drift region 30. The substrate 10 is a P-type substrate, and the drift region 30 is an N-type drift region.

Figure 2:
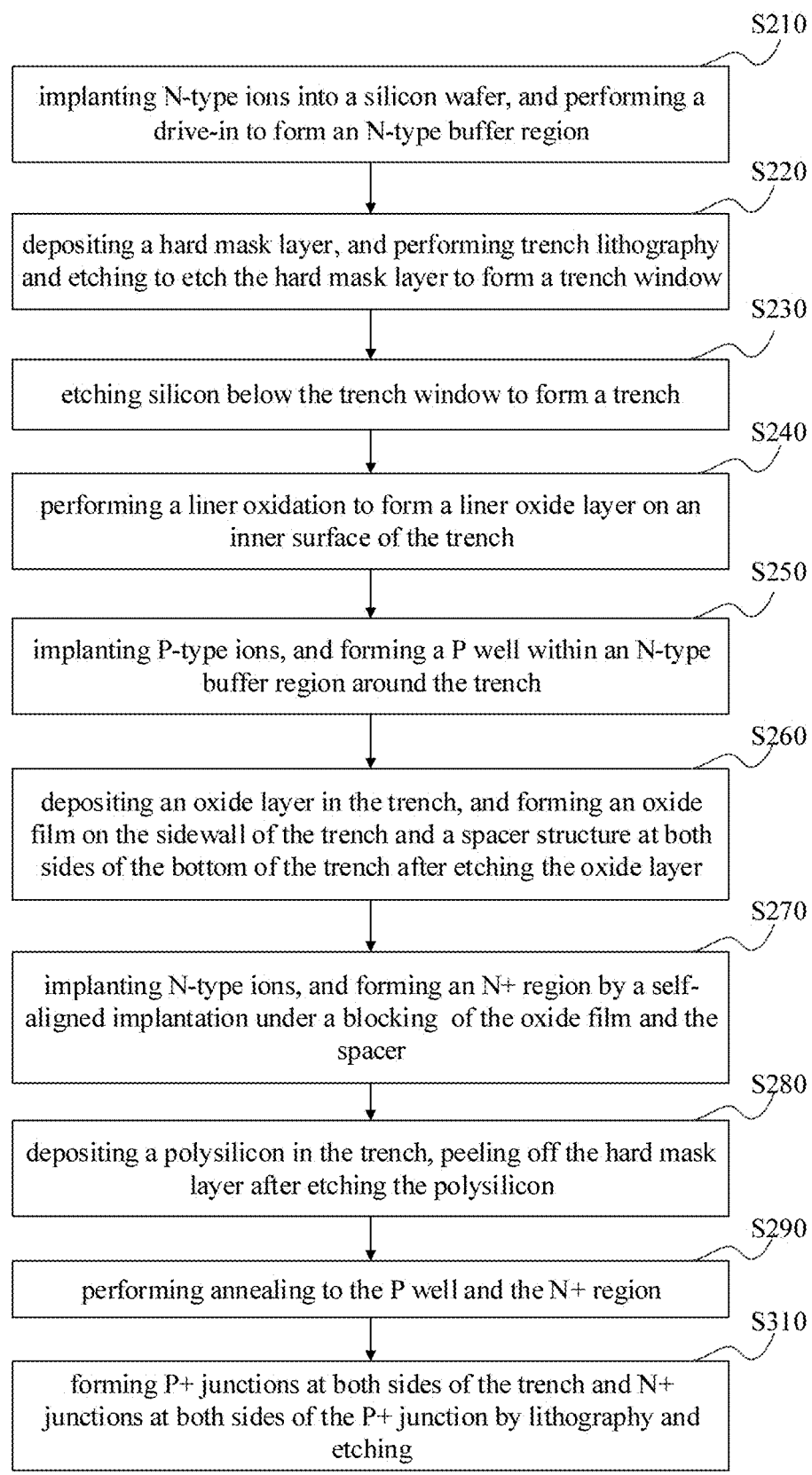
FIG. 2 is a flow chart of a method of manufacturing the lateral insulated-gate bipolar transistor according to one embodiment.

FIG. 2 is a flow chart of a method of manufacturing a lateral insulated-gate bipolar transistor according to one embodiment, which includes:

In step S210, N-type ions are implanted into a silicon wafer, and a drive-in is performed to form an N-type buffer region.

In step S220, a hard mask layer is deposited, and trench lithography and etching are performed to etch the hard mask layer to form a trench window.

The hard mask layer is deposited on a surface of the silicon wafer, and a photoresist is coated on a surface of the hard mask layer to perform lithography. The hard mask exposed under the photoresist after lithography is etched away to form a trench window, thereby exposing the underlying silicon. In the illustrated embodiment, the hard mask layer is a silicon nitride layer. In alternative embodiments, other hard masks known in the art can also be used.

In one embodiment, a pad oxide layer is also formed prior to deposition of the hard mask layer.

In step S230, silicon below the trench window is etched to form a trench.

In the illustrated embodiment, etching is performed to form a structure gradually decreased in width from top to bottom to form a slope and having a wide top and a narrow bottom.

In step S240, a liner oxidation is performed to form a liner oxide layer on an inner surface of the trench.

Since the crystal orientations of the sidewall and the bottom of the trench are different, there is a difference in the oxidation rate of the liner oxide layer, and a thickness of the oxide layer at the sidewall is greater than a thickness of the oxide layer at the bottom.

In step S250, P-type ions are implanted, and a P well is formed within an N-type buffer region around the trench.

The P-type ions are implanted through the trench window, and the ions pass through the oxide layer and form the P well within the N-type buffer region around the trench. Since the thickness of the oxide layer at the sidewall of the trench is greater than the thickness of the oxide layer at the bottom, the concentration distribution of the P-type ions in the P well will be affected accordingly.

In step S260, an oxide layer is deposited in the trench. An oxide film is formed on the sidewall of the trench, and spacer structures are formed at both sides of the bottom of the trench after etching the oxide layer.

In the illustrated embodiment, a chemical vapor deposition is performed using ethyl orthosilicate (TEOS) as a reactant to form a silicon dioxide layer. In alternative embodiments, oxide layers can also be formed using other techniques known in the art. After the deposition, the oxide film is formed on the sidewall of the trench and the spacer structures are formed at both sides of the bottom of the trench using an anisotropic etching. In addition, a void of the oxide layer is formed in a middle portion of the bottom of the trench, which serves as a window of N+ implantation in step S270.

In step S270, N-type ions are implanted, and an N+ region is formed by a self-aligned implantation under a blocking of the oxide film and the spacer structures.

The N-type ions are implanted into the trench, and the N+ region is formed by the self-aligned implantation under the blocking of the oxide film and the spacer structures.

The N+ region formed by the self-aligned implantation and the P well, as well as the N-type buffer region form a longitudinal vertical NPN structure, which serves as a critical means of controlling minority carrier lifetime.

In step S280, a polysilicon is deposited in the trench, and the hard mask layer is peeled off after etching the polysilicon.

The polysilicon is deposited and the redundant polysilicon outside the trench is etched away, and then the hard mask layer is removed. In the illustrated embodiment, prior to the step of depositing the polysilicon, the method further includes a step of rinsing the silicon dioxide adjacent to the N+ region, so as to remove the silicon dioxide impurities.

In the illustrated embodiment, the polysilicon 74 is N+ heavily doped, and the dopant concentration is in an order of $E^{21}$ to $E^{22}$ cm$^{-3}$.

In step S290, annealing is performed to the P well and the N+ region.

The thermal annealing is performed to activate the doped ions in the P well, the N+ region, and the like. After the annealing is completed, the manufacturing process in other regions of the device is performed, such as a CMOS process.

In step S310, P+ junctions are formed at both sides of the trench and N+ junctions are formed at both sides of the P+ junction by lithography and etching.

After the implantation is completed, the annealing is also performed accordingly, and then the subsequent process of the device is performed.

In one embodiment, the implantation in the step S250 is performed by multiple implantations, thus a dopant concentration gradient with slower varying is obtained, which can optimize the distribution morphology of the impurities of the P well, and even achieve a constant dopant concentration in a certain region, and help to increase the magnification of N+/P−/N− triodes and accelerate the extraction speed of the holes.

A schematic view of the lateral insulated-gate bipolar transistor manufactured using the aforementioned method is shown in FIG. 1. In the lateral insulated-gate bipolar transistor, a plurality of holes are injected during forward conduction, thereby forming a significant conductivity modulation effect to reduce the on-state resistance. On the other hand, when the device is turned off, the N+ region and the N+ junction can quickly absorb the minority carrier holes, thereby greatly reducing turn-off loss. In other words, by optimizing the collector of the LIGBT, the deep collector P well and the P+ junction are introduced through the trench structure, and the N+ polysilicon and the N+ region are formed. During forward conduction, a wide distribution of electron/hole current channel is formed, thereby improving the current capability. During reverse blocking, the optimized collector helps to collect the minority carrier holes more quickly and reduce the turn-off time. In one embodiment, the dopant concentration of the N-type buffer region 42 ranges from $2E^{15}$ to $5E^{15}$ cm$^{-3}$, the dopant concentration of the P well 44 ranges from $4E^{17}$ to $8E^{17}$ cm$^{-3}$, and the dopant concentrations of the P+ junction 53 and the N+ junction 55 range from $5E^{20}$ to $10E^{20}$ cm$^{-3}$.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A lateral insulated-gate bipolar transistor, comprising:
 a P-type substrate;
 a cathode terminal located on the substrate;
 an anode terminal located on the substrate, the anode terminal comprising an N-type buffer region located on the substrate, a P well located in the N-type buffer region, an N+ region located in the P well, a trench located above the N+ region and partially surrounded by the P well, a polysilicon located in the trench, P+ junctions located at both sides of the trench, and N+ junctions located at both sides of the P+ junction;
 a drift region located between the anode terminal and the cathode terminal; and
 a gate located between the anode terminal and the cathode terminal;
 wherein the trench is a structure gradually increased in width from bottom to top to form a slope and having a narrow bottom and a wide top.

2. The lateral insulated-gate bipolar transistor according to claim 1, wherein a dopant concentration of the N-type buffer region is less than a dopant concentration of the P well, and the dopant concentration of the P well is less than dopant concentrations of the P+ junction and the N+ junction.

3. The lateral insulated-gate bipolar transistor according to claim 2, wherein the dopant concentration of the N-type buffer region ranges from $2E^{15}$ to $5E^{15}$ cm$^{-3}$, the dopant concentration of the P well ranges from $4E^{17}$ to $8E^{17}$ cm$^{-3}$, and the dopant concentrations of the P+ junction and the N+ junction range from $5E^{20}$ to $10E^{20}$ cm$^{-3}$.

4. The lateral insulated-gate bipolar transistor according to claim 1, wherein the anode terminal further comprises an oxide layer located on an inner surface of the trench, the oxide layer comprises an oxide film located on a sidewall of the trench and a spacer structure located at both sides of a bottom of the trench, the oxide layer has a void at a position corresponding to a middle portion of the bottom of the trench, such that the polysilicon is in direct contact with the N+ region below.

5. The lateral insulated-gate bipolar transistor according to claim 1, wherein a dopant concentration of the polysilicon ranges from $1E^{21}$ to $10E^{22}$ cm$^{-3}$.

6. The lateral insulated-gate bipolar transistor according to claim 1, wherein the lateral insulated-gate bipolar transistor is a silicon-on-insulator type lateral insulated-gate bipolar transistor; the lateral insulated-gate bipolar transistor further comprises a buried oxide layer located between the substrate and the drift region; the substrate is a P-type substrate, and the drift region is an N-type drift region.

7. The lateral insulated-gate bipolar transistor according to claim 1, wherein the P-well extends into contact with the P+ junctions.

8. The lateral insulated-gate bipolar transistor according to claim 1, wherein the P-well and the P+ junctions separate the trench from the N-type buffer region.

* * * * *